April 17, 1962 G. REICHENBAUM 3,029,505

METHOD OF ATTACHING A SEMI-CONDUCTOR DEVICE TO A HEAT SINK

Filed Sept. 29, 1958

INVENTOR:
George Reichenbaum
BY:
Baldwin & Wight
HIS ATTORNEYS

United States Patent Office 3,029,505
Patented Apr. 17, 1962

3,029,505

METHOD OF ATTACHING A SEMI-CONDUCTOR DEVICE TO A HEAT SINK

George Reichenbaum, London, England, assignor to English Electric Valve Company Limited, London, England, a British company Filed Sept. 29, 1958, Ser. No. 764,125
Claims priority, application Great Britain Oct. 28, 1957
2 Claims. (Cl. 29—501)

Figure 1:
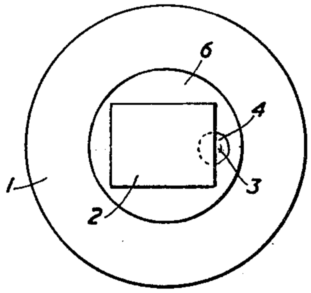

This invention relates to semi-conductor devices and more particularly to such devices of the kind in which the device proper—usually a germanium wafer—is fixed to a copper or other base of high thermal conductivity which acts as a heat sink to cool the wafer.

In semi-conductor devices for high powers it is necessary to provide good cooling of the P-N junction to prevent its being damaged by excessive heating. This is usually done by providing a heat sink as near to the junction as possible. The sink is usually in the form of a copper base, sometimes water cooled. It is obviously a requirement that the thermal contact between the sink and the wafer shall be as good as possible and over as large an area as possible. It is by no means easy to satisfy this requirement. Customary present day practice is to insert a sheet of the material known commercially as "Nilo–K" (this is an alloy of Ni, Cu and Fe) between one flat face of the wafer and a flat face of the copper base and then to fire the surfaces together. Nilo–K wets relatively easily but it is of relatively low thermal conductivity and therefore, although it provides a good joint mechanically, the heat transfer it provides between the wafer and the base falls far short of what is desirable.

The present invention seeks to provide an improved method of fixing a semi-conductor device to a heat sink so as to give not only good mechanical attachment, but also to give good heat transfer properties from the said device to the said sink. As will be seen later the method of the invention provides attachment by solder—which is of high thermal conductivity—without the need to employ chemical fluxes with their relatively poor wetting properties and liability to cause corrosion either at the time of use, or later, or both.

According to this invention a semi-conductor device is attached to a heat sink therefor by a method which includes the steps of preparing the device and the sink with surfaces adapted to mate with one another; providing the sink with a small localised reservoir containing a small reserve of solder; placing the mating surface of the device on that of the sink so as to contact with the solder; and firing to cause the solder to flow by capillary action and wet substantially the whole mating surface of the device. In this way, when the solder is allowed to solidify, the result is achieved that the device is soldered to the sink by a thin layer of solder of high conductivity which extends over substantially the whole of the mating surface area. The solder may be fired in the reservoir by a preliminary firing step—preferably effected at a temperature a little lower than that of the main firing step.

Preferably the firing step—or both if there are two—is carried out in a hydrogen atmosphere.

Preferably the reservoir is a small hole in the sink at or near one edge of the mating surface thereof. It assists the even flow of solder between the two mating surfaces to arrange one edge of the mating surface of the semi-conductor device in contact with the solder in the reservoir.

Figure 2:
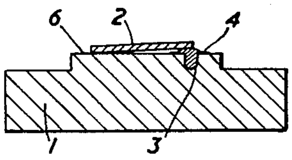
Figure 3:
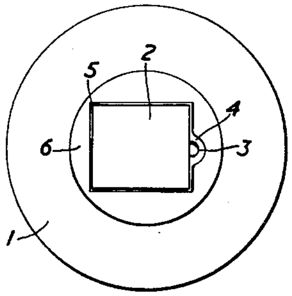
Figure 4:
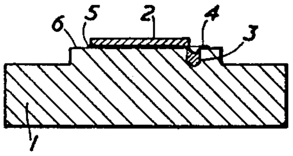

The invention is illustrated and further explained in connection with the accompanying drawings in which FIGURES 1 and 2 are schematic plan and sectional views respectively showing a semi-conductor device on a sink after the firing of solder in a reservoir therein, and FIGURES 3 and 4 similar views showing the result after a second firing. Like figures denote like parts throughout.

Referring to FIGURES 1 and 2, 1 represents a heat sink constituted by a copper base with a ground flat surface 6 in which is drilled a hole 3 approximately ⅛" deep and of about the same diameter to form a well or reservoir for solder represented at 4. On the base 1 and with its edge in contact with the solder, is a rectangular semi-conducting specimen 2 such, for example, as a germanium wafer, having a flat underface with which the face 6 mates. The solder in the well is fired to the heat sink by a first firing step before the wafer is put in position. Before this firing step the smooth surfaces to be joined are, of course, cleaned carefully, for example by washing the semi-conductor specimen 2 in a mixture of nitric and hydrofluoric acid and immersing the ground surface 6 in nitric acid diluted 3:1 with water, after which a final cleaning of both surfaces in a saturated solution of hydroquinone (a reducing agent) is advantageous. Surfaces thus cleaned can be stored in the clean condition for some considerable time in a fresh solution of hydroquinone. A suitable and satisfactory solder giving excellent wetting is 60/40 eutectic Pb/Sn and the first firing step is preferably accomplished by heating to about 400° C. in a hydrogen atmosphere. The copper heat sink is then cooled and the semi-conductor specimen 2 is placed in position as shown in FIGURES 1 and 2 with the centre of one edge on the pre-fired solder 4. The second firing step is then accomplished again in a hydrogen atmosphere, preferably at a temperature of about 500° C. When the solder has melted sufficiently to allow the semi-conductor layer to fall flat on to the ground surface 6 as shown in FIGURE 4, the solder will start to creep from the well 3 between the two smooth surfaces, due to capillary action. It will also slightly creep up the edges of the specimen 2 as shown at 5 in FIGURES 3 and 4 but will not extend substantially beyond the specimen 2. An addition of approximately 1 mgm. of silver to the solder during the second firing is found to produce better wetting of the surfaces.

In place of the first firing step a plug of solder, long enough to protrude a little from the well, may be placed therein and the protruding solder flattened. The surfaces can then be joined as before by a single firing step (corresponding to the second firing step in the above described process) in a hydrogen atmosphere at about 400° C. The addition of silver in this case is of little or no advantage.

I claim:

1. A method of attaching a semi-conductor device to a heat sink therefor, said method including the steps of preparing the device and the sink with surfaces adapted to mate with one another, forming a well of predetermined size in said sink to act as a receptacle for solder, placing in said well a predetermined quantity of solder, said quantity being the minimum for satisfactory soldering of said device to the sink, the dimensions of said well being predetermined so that said solder extends above the upper edges of said well, the quantity of solder being sufficient to fill the well when molten and provide an excess which is the minimum for satisfactory soldering, shaping the upper surface of said solder so that the device can be positioned thereon, placing the mating surface of the device on the mating surface of the sink so as to contact the solder on one edge, and firing to cause the solder to flow by capillary action and wet substantially the whole mating surface of the device.

2. In a method according to claim 1, placing said device on said sink with one edge of said device resting upon and in contact with the solder extending above the mating surface of said sink, and with the opposite edge of said device resting upon and in contact with the mating surface of said sink spaced from said solder.

References Cited in the file of this patent

UNITED STATES PATENTS

| | | |
|---|---|---|
| 582,138 | Hedenberg et al. | May 4, 1897 |
| 1,801,171 | Mueller et al. | Apr. 14, 1931 |
| 2,131,890 | Hopkins | Oct. 4, 1938 |
| 2,301,915 | Harrington | Nov. 17, 1942 |
| 2,359,926 | McCullough | Oct. 10, 1944 |
| 2,448,907 | Ost | Sept. 7, 1948 |
| 2,460,667 | Wurzberger | Feb. 1, 1949 |
| 2,479,047 | Long | Aug. 16, 1949 |

| | | |
|---|---|---|
| 2,508,466 | Brace et al. | May 23, 1950 |
| 2,706,328 | Katmazin | Apr. 19, 1955 |
| 2,763,822 | Frola et al. | Sept. 18, 1956 |
| 2,867,899 | Jacobs | Jan. 13, 1959 |

OTHER REFERENCES

RCA Technical Note No. 49. Published by The Radio Corp. of America, RCA Laboratories, Princeton, N.J. Received in Patent Office Library on August 9, 1957. 29–25.3.

How and When To Use Electric-Furnance Brazing, GEA–3193C, pp. 28 and 29. Published in 1939 by General Electric Co., Apparatus Department, Schenectady, N.Y. 29–484.